(12) United States Patent
Wyant et al.

(10) Patent No.: US 11,837,518 B2
(45) Date of Patent: Dec. 5, 2023

(54) COATED SEMICONDUCTOR DIES

(71) Applicant: TEXAS INSTRUMENTS INCORPORATED, Dallas, TX (US)

(72) Inventors: Michael Todd Wyant, Dallas, TX (US); Matthew John Sherbin, Dallas, TX (US); Christopher Daniel Manack, Flower Mound, TX (US); Patrick Francis Thompson, Allen, TX (US); You Chye How, Melaka (MY)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 17/003,382

(22) Filed: Aug. 26, 2020

(65) Prior Publication Data

US 2022/0068744 A1  Mar. 3, 2022

(51) Int. Cl.
| | |
|---|---|
| *H01L 23/31* | (2006.01) |
| *H01L 23/552* | (2006.01) |
| *H01L 21/56* | (2006.01) |
| *H01L 21/78* | (2006.01) |
| *H01L 21/683* | (2006.01) |

(52) U.S. Cl.
CPC ........ *H01L 23/3185* (2013.01); *H01L 21/561* (2013.01); *H01L 21/568* (2013.01); *H01L 21/78* (2013.01); *H01L 23/3171* (2013.01); *H01L 23/552* (2013.01); *H01L 21/6836* (2013.01); *H01L 2221/68336* (2013.01)

(58) Field of Classification Search
None
See application file for complete search history.

(56) References Cited

U.S. PATENT DOCUMENTS

| | | | |
|---|---|---|---|
| 2003/0090006 A1* | 5/2003 | Farnworth | B33Y 80/00 264/494 |
| 2006/0151203 A1* | 7/2006 | Krueger | H03H 9/1071 29/841 |
| 2006/0249802 A1* | 11/2006 | Stelzl | H03H 9/059 257/778 |
| 2008/0191335 A1 | 8/2008 | Yang et al. | |
| 2012/0286412 A1* | 11/2012 | Kimura | H01L 23/49551 257/676 |
| 2014/0252387 A1* | 9/2014 | Kishi | H01L 33/507 257/98 |
| 2015/0243575 A1* | 8/2015 | Strothmann | H01L 24/96 257/734 |

(Continued)

FOREIGN PATENT DOCUMENTS

| | | |
|---|---|---|
| WO | 9918609 A1 | 4/1999 |
| WO | 2010129091 A2 | 11/2010 |

OTHER PUBLICATIONS

PCT International Search Report No. PCT/US 2021/047069, dated Nov. 25, 2021, 2 pages.

*Primary Examiner* — Jay C Chang
(74) *Attorney, Agent, or Firm* — Yudong Kim; Frank D. Cimino

(57) ABSTRACT

In examples, a chip scale package (CSP) comprises a semiconductor die; a conductive terminal coupled to the semiconductor die; and a non-conductive coat covering a backside of the semiconductor die and a sidewall of the semiconductor die. The non-conductive coat has a thickness of less than 45 microns.

19 Claims, 16 Drawing Sheets

(56) References Cited

U.S. PATENT DOCUMENTS

| | | | |
|---|---|---|---|
| 2015/0360424 A1* | 12/2015 | Williams | B29C 70/388 |
| | | | 156/289 |
| 2016/0293463 A1* | 10/2016 | Nishizaki | H01L 21/681 |
| 2019/0131210 A1* | 5/2019 | Hino | H01L 24/48 |
| 2019/0190606 A1* | 6/2019 | Riviere | H05K 5/03 |

* cited by examiner

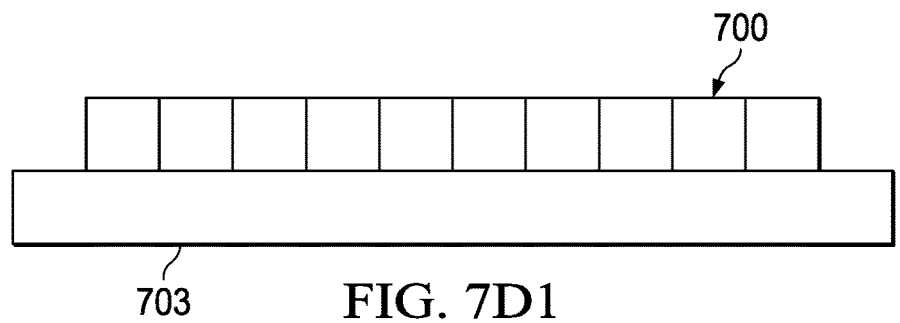
FIG. 7D1
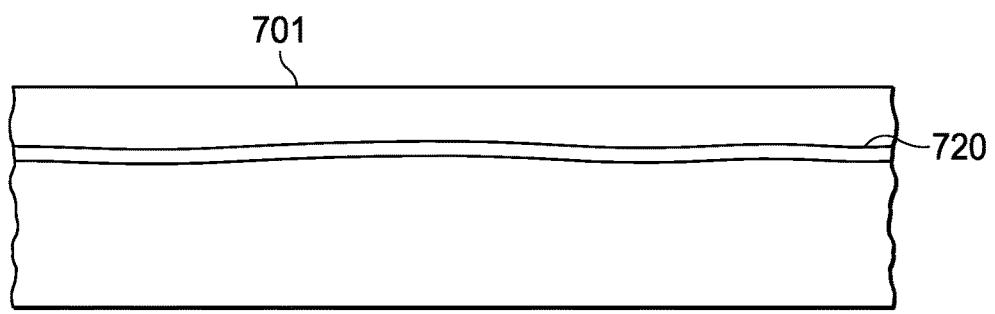
FIG. 7D2
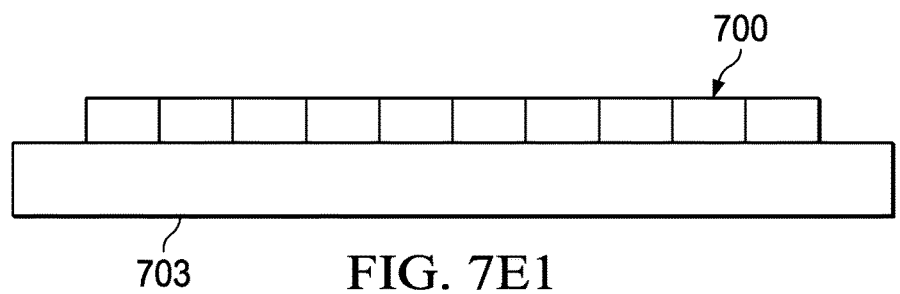
FIG. 7E1
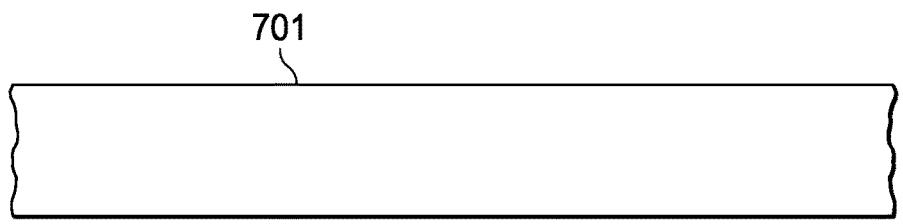
FIG. 7E2

COATED SEMICONDUCTOR DIES

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on the die pad or another lead frame pad. The assembly is later covered in a mold compound, such as epoxy, to protect the assembly from potentially damaging heat, physical trauma, moisture, and other deleterious factors. The finished assembly is called a semiconductor package or, more simply, a package.

However, other types of packages, such as chip-scale packages (CSP), typically do not include a mold compound covering the semiconductor die. Rather, in many such CSPs, electrically conductive terminals (e.g., solder balls) are formed on an active surface of the die, and the die is then flipped onto an application, such as a printed circuit board (PCB). As a result, an inactive surface of the die is exposed to the environment. This inactive surface of the die is generally successful in shielding the active areas of the die and other electrical connections from harmful influences. Such CSPs—for example, wafer-level CSPs (WL-CSP or WCSP)—are favored for their small sizes and reduced manufacturing costs.

SUMMARY

In examples, a chip scale package (CSP) comprises a semiconductor die; a conductive terminal coupled to the semiconductor die; and a non-conductive coat covering a backside of the semiconductor die and a sidewall of the semiconductor die. The non-conductive coat has a thickness of less than 45 microns.

In examples, a method comprises coupling a surface of a semiconductor wafer to a dicing tape, the surface opposite an active surface of the semiconductor wafer; singulating the semiconductor wafer to produce a semiconductor die; removing the semiconductor die from the dicing tape; and covering at least a portion of each of five surfaces of the semiconductor die with a non-conductive coat using a spray technique or an immersion technique.

BRIEF DESCRIPTION OF THE DRAWINGS

For a detailed description of various examples, reference will now be made to the accompanying drawings in which:

FIGS. 7A-7J depict a process flow for fabricating a semiconductor die having a metal coat on a backside of the semiconductor die, in accordance with various examples.

DETAILED DESCRIPTION

Figure 1A:
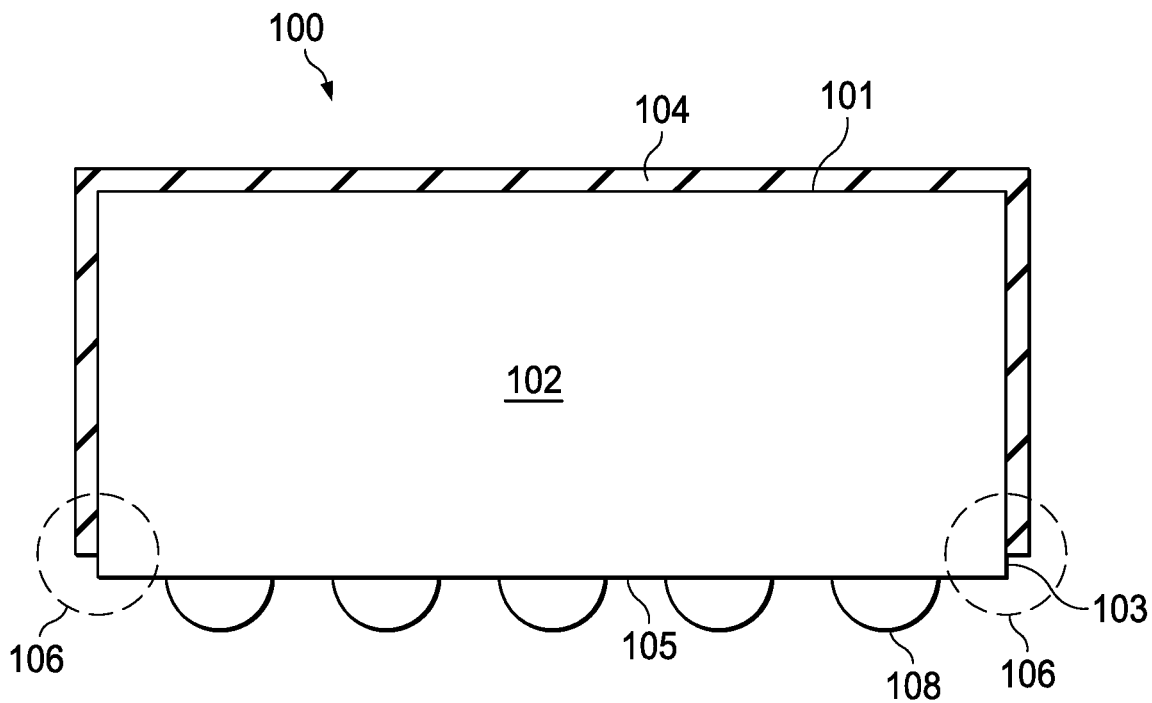
FIG. 1A depicts a cross-sectional schematic view of a chip scale package (CSP) having a non-conductive coat on a backside and portions of sidewalls of the CSP, in accordance with various examples.

Despite the aforementioned advantages of CSPs, in some applications, the lack of a mold compound in CSPs causes inadequate protection of the active surface of the semiconductor die from deleterious influences. Some such CSPs include semiconductor dies with optical circuitry formed on the active surfaces of the dies. The semiconductor material is unable to block certain types of ambient light, such as infrared light, from penetrating the inactive areas of the semiconductor die and propagating to the active areas of the die. When such light reaches the active areas of the semiconductor die, the light interacts with the optical circuitry that is present at the active areas of the die, thereby negatively impacting the performance of the optical circuitry. Ambient light can damage functionality in other ways. For example, the photovoltaic properties of semiconductors can also cause the semiconductor dies to produce electrical signals in response to ambient light, and these electrical signals can interfere with the signals on the active surface of the die.

Techniques exist to cover the backsides and sidewalls of CSPs with non-conductive coats. In such techniques, dies are singulated from a semiconductor wafer after active circuits have been formed on the semiconductor wafer. The singulated dies are picked (e.g., using a robotic arm) from a dicing tape on which they were singulated and are placed together to reconstitute the wafer. Reconstituting the wafer means placing the singulated dies in close proximity to, but without touching, each other such that the singulated dies collectively appear similar in form to a monolithic semiconductor wafer. The singulated dies in the reconstituted wafer are spaced sufficiently from each other so that a mold compound may flow between the singulated dies, thus coating not only the backsides but also the sidewalls of the singulated dies. After the mold compound is cured, another singulation process is performed, this time cutting not through semiconductor material but through the mold compound positioned in between the dies. Such a reconstitution technique is expensive, tedious, time-consuming, and inefficient. Furthermore, the packages that result from reconstitution techniques tend to have undesirably thick mold compound covers.

In still other techniques, a mold compound coat may be applied to the backside of a wafer prior to singulating the wafer. However, this technique precludes the coating of die sidewalls. In addition, this technique precludes singulation using laser dicing saws, because lasers generally are not able to adequately penetrate the mold compound coat.

In some situations, a metal coat is used instead of a mold compound. Metal coats may be used to reflect ambient light, for example to mitigate the ambient light challenges described above. Metal coats also may be used for thermal purposes (e.g., to dissipate heat from semiconductor dies) or for electrical purposes (e.g., grounding circuitry of a semiconductor die through the bulk semiconductor). However, the benefits of laser dicing, such as achieving low wafer thicknesses and increased dicing efficiency and precision, cannot be obtained because the metal coat reflects the laser. Thus, the laser is unable to penetrate the metal coat.

This disclosure describes various examples of techniques whereby backsides and sidewalls of singulated dies may be covered using a light-blocking (e.g. infrared light blocking), non-conductive coat, without the expense, tedium, time investment, and inefficiency associated with the aforementioned wafer reconstitution techniques. In addition, because the non-conductive coat is applied post-singulation, laser dicing saws may still be used for singulation purposes, as the laser dicing saws do not have to penetrate the non-conductive coat. Thus, advantages associated with laser dicing—for example, kerf reduction and mitigating of chipping on edges—may be realized. In some examples, a semiconductor wafer having active circuits formed thereupon is positioned on a dicing tape. The semiconductor wafer is then laser diced to produce singulated dies. In some examples, the singulated dies are picked from the dicing tape (e.g., using a turret system) and are positioned inside a chamber, where the non-conductive coat is sprayed (e.g., using an atomized spray) onto the backside and sidewalls of each singulated die. In other examples, the singulated dies are picked from the dicing tape (e.g., using a turret system) and are immersed in a non-conductive coat container, where the non-conductive coat covers the backside and sidewalls of each singulated die.

In addition, this disclosure describes various examples of techniques whereby backsides and sidewalls of singulated dies may be covered using a light-blocking (e.g., infrared light blocking) metal coat and may be diced using a laser, thus realizing the benefits of both the metal coat and laser dicing. In some examples, a semiconductor wafer is positioned on a glass carrier plate. The semiconductor wafer is laser diced, and then the backside of the semiconductor wafer is subjected to a grinding process. A metal coat is applied to the backside of the semiconductor wafer, for example using a plating process. The semiconductor wafer is then mounted to a dicing tape and the glass carrier plate is decoupled from the semiconductor wafer. The dicing tape is stretched using an expander tool to separate the semiconductor wafer into individual semiconductor dies, each semiconductor die having a metal coat on its backside. In some examples, both the backside and sidewalls of semiconductor dies may be covered using metal coats. In such examples, a semiconductor wafer may be mounted on a backgrind tape, with the active surface of the semiconductor wafer contacting the backgrind tape. The semiconductor wafer is then laser diced, and a grinding process is performed on a backside of the semiconductor wafer. The tape is then stretched using an expander tool, thereby forming gaps between the singulated semiconductor dies. A plating process covers the backsides and the sidewalls of the semiconductor dies. Various such examples are now described with reference to the drawings.

FIG. 1A depicts a cross-sectional schematic view of a chip scale package (CSP) 100, in accordance with various examples. In some examples, the CSP 100 comprises a wafer level chip scale package (WCSP). The CSP 100 includes a semiconductor die 102, for example, a silicon die. The CSP 100 comprises a non-conductive coat 104 covering multiple surfaces of the semiconductor die 102. For example, the non-conductive coat 104 abuts a backside 101 of the semiconductor die 102. In examples, the non-conductive coat 104 abuts one or more sidewalls 103 of the semiconductor die 102. Accordingly, the non-conductive coat 104 covers between one and five surfaces (e.g., planes) of the CSP 100. In examples, the non-conductive coat 104 does not abut an active surface 105 of the semiconductor die 102. In examples, the non-conductive coat 104 comprises a material such as epoxy, resin, paint, tape, mold compound, or laminate, although the scope of disclosure is not limited to these specific materials.

In examples, the thickness of the non-conductive coat 104 ranges from 3 microns to 5 microns. In examples, the thickness of the non-conductive coat 104 ranges from 2 microns to 6 microns. In examples, the thickness of the non-conductive coat 104 ranges from 1 micron to 7 microns. In examples, the thickness of the non-conductive coat 104 ranges from 0.5 microns to 10 microns. In examples, the thickness of the non-conductive coat 104 ranges from 0.01 microns to 50 microns. In examples, the thicknesses of all areas of the non-conductive coat 104 may be uniform, and in other examples, the thicknesses of different areas of the non-conductive coat 104 may differ. The thickness chosen is not a mere design choice. Rather, a thicker non-conductive coat 104 is advantageous because it has increased mechanical abrasion resistance, but it is disadvantageous because it is more expensive and increases package size. Conversely, a thinner non-conductive coat 104 is advantageous because it reduces cost and reduces package size, but it is disadvantageous because it has reduced mechanical abrasion resistance.

In examples, the non-conductive coat 104 abuts some, but not all, of each sidewall 103. For example, as numeral 106 indicates, a strip of each sidewall 103 extending lengthwise adjacent to the active surface 105 may lack the non-conductive coat 104. This uncoated strip may circumscribe the semiconductor die 102 and may have a width ranging from 10 microns to 15 microns. The width of the uncoated strip indicated by numeral 106 is not merely a design choice. Rather, a wider strip is advantageous because it reduces cost, but the wider strip is disadvantageous because it offers less protection to the semiconductor die. Conversely, a narrower strip is advantageous because it offers greater protection for the semiconductor die, but the narrower strip is disadvantageous because it is more expensive.

Conductive terminals 108 couple to the active surface 105 (e.g., to a redistribution layer (RDL) that couples to circuitry on the active surface 105, not expressly shown). In examples, the conductive terminals 108 are spherical (e.g., balls), although the scope of this disclosure is not limited as such.

Figure 1B:
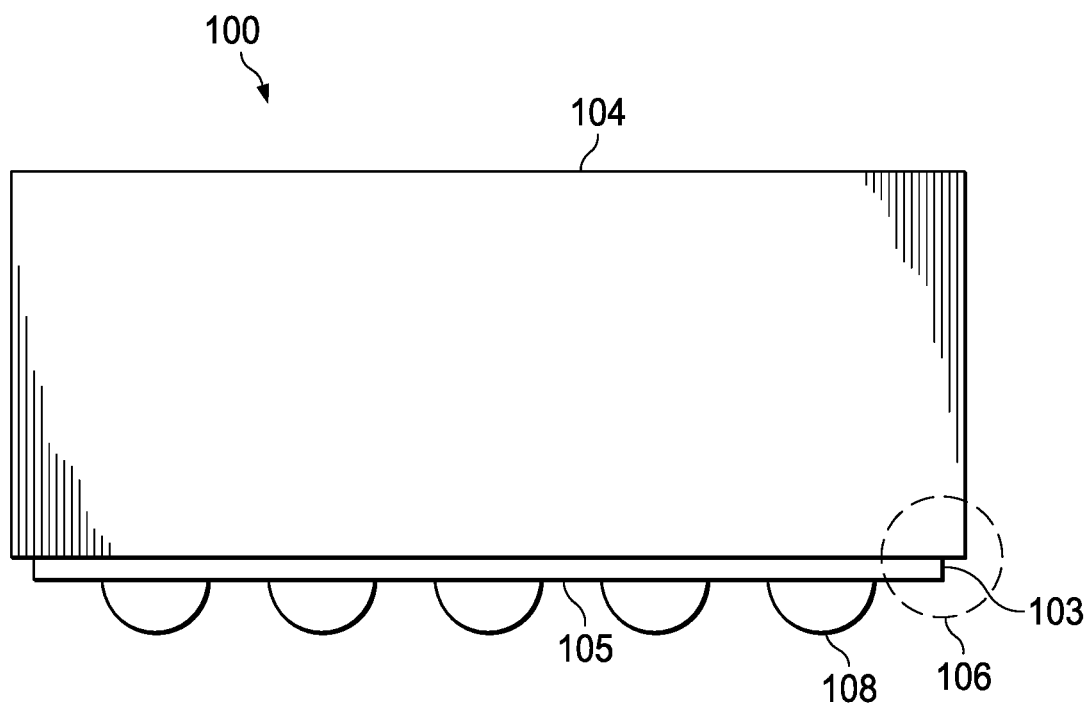
FIG. 1B depicts a profile view of a CSP having a non-conductive coat on a backside and portions of sidewalls of the CSP, in accordance with various examples.
Figure 1C:
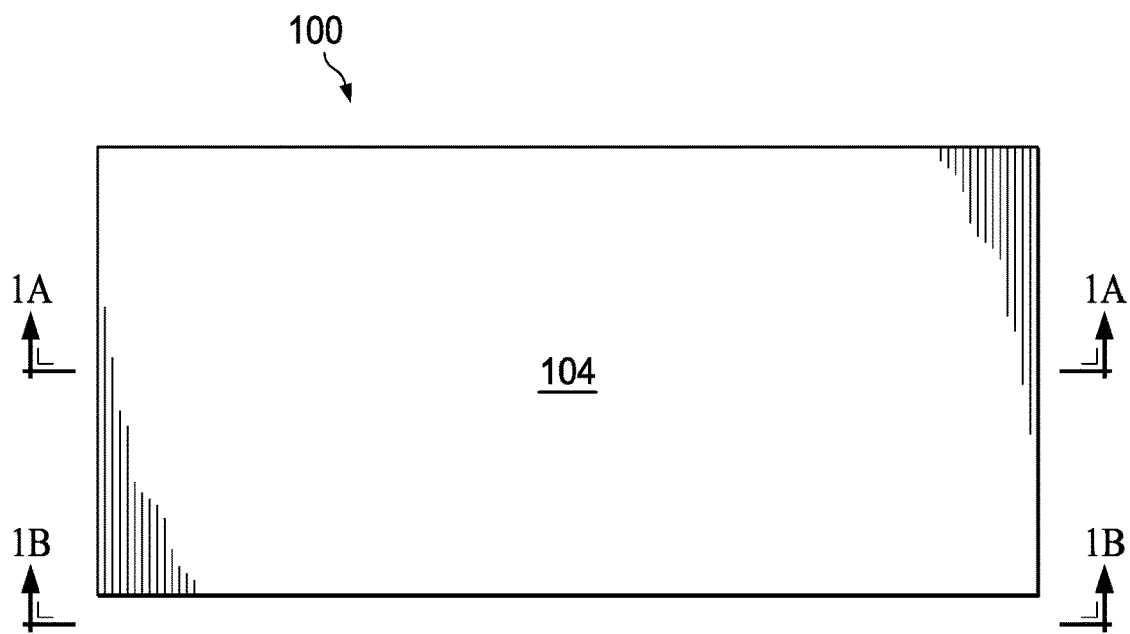
FIG. 1C depicts a top-down view of a CSP having a non-conductive coat on a backside and portions of sidewalls of the CSP, in accordance with various examples.
Figure 1D:
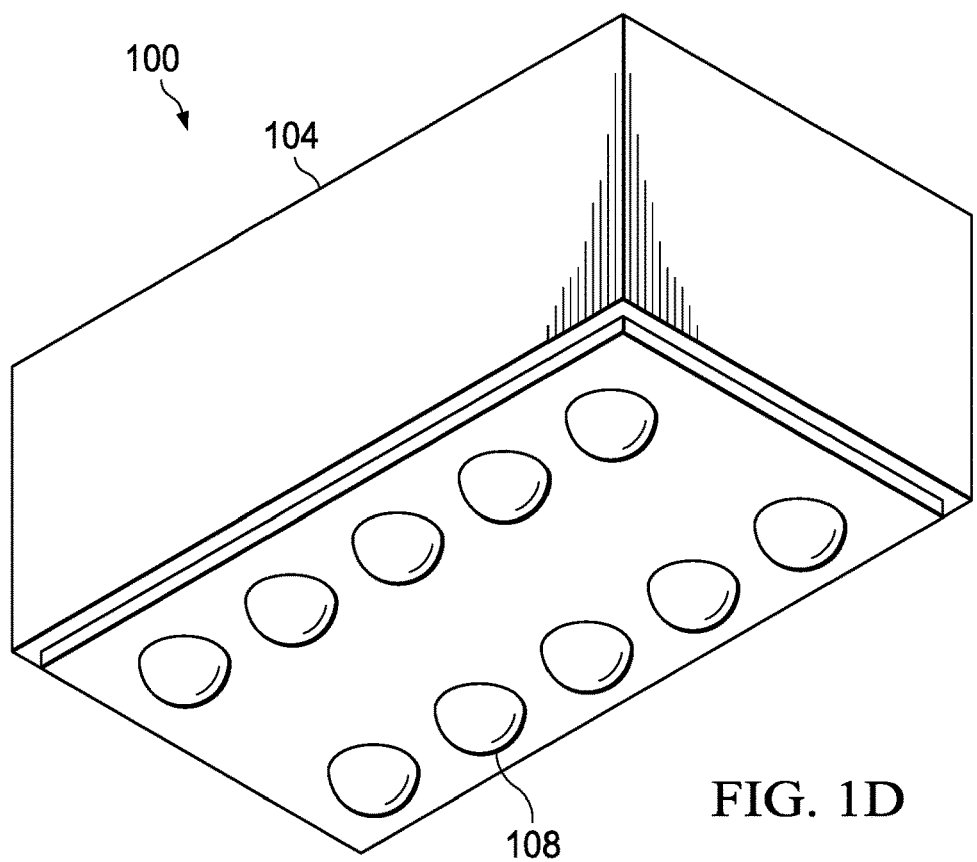
FIG. 1D depicts a perspective view of a CSP having a non-conductive coat on a backside and portions of sidewalls of the CSP, in accordance with various examples.

FIG. 1B depicts a profile view of the CSP 100, in accordance with various examples. FIG. 1C depicts a top-down view of the CSP 100, in accordance with various examples. FIG. 1D depicts a perspective view of the CSP 100, in accordance with various examples.

Figure 2A:
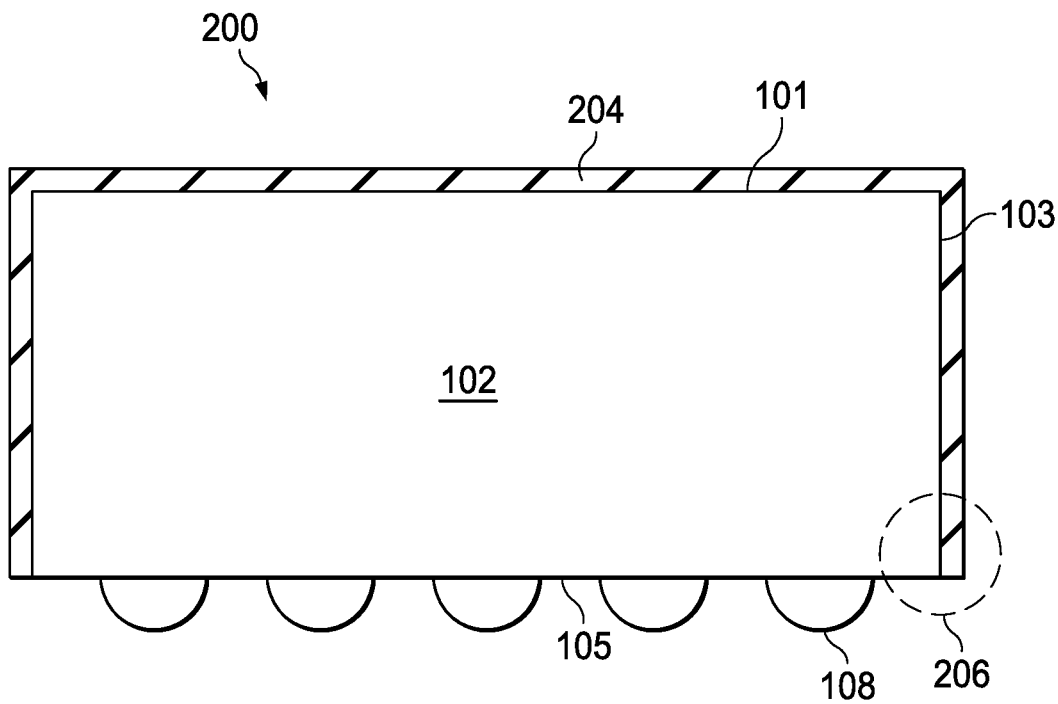
FIG. 2A depicts a cross-sectional schematic view of a CSP having a non-conductive coat on a backside and sidewalls of the CSP, in accordance with various examples.

FIG. 2A depicts a cross-sectional schematic view of a chip scale package (CSP) 200, in accordance with various examples. The CSP 200 is identical to the CSP 100 depicted in FIGS. 1A-1D, except that the non-conductive coat 204 is provided in lieu of the non-conductive coat 104. The non-conductive coat 204 is identical to the non-conductive coat 104, except that the non-conductive coat 204 abuts all portions of the sidewalls 103. For example, as numeral 206 indicates, the strip 106 of exposed sidewalls 103 depicted in FIG. 1A is covered by the non-conductive coat 204 in FIG. 2A. Whether a non-conductive coat covers all (e.g., non-conductive coat 204) or less than all (e.g., non-conductive coat 104) portions of sidewalls 103 depends on the technique used to fabricate the CSP, as is described in detail below.

Figure 2B:
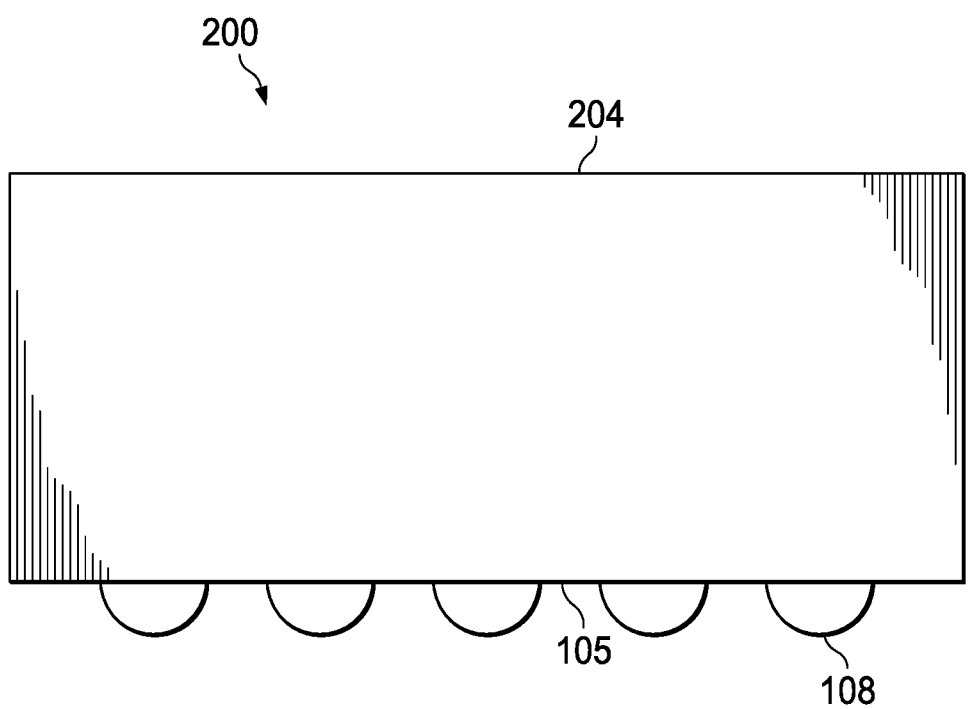
FIG. 2B depicts a profile view of a CSP having a non-conductive coat on a backside and sidewalls of the CSP, in accordance with various examples.
Figure 2C:
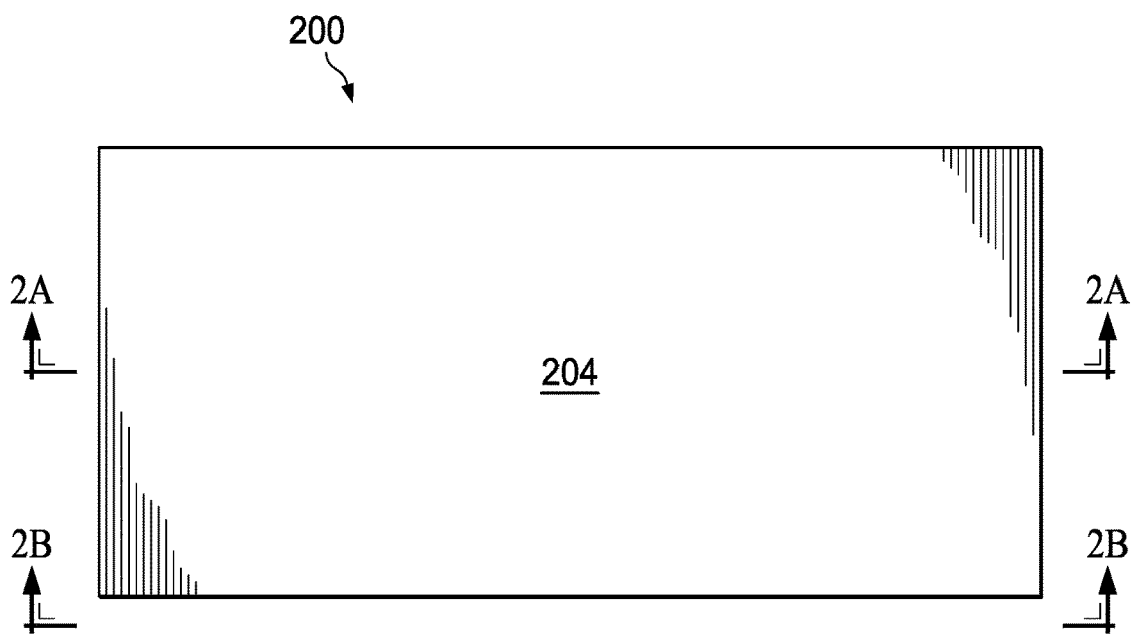
FIG. 2C depicts a top-down view of a CSP having a non-conductive coat on a backside and sidewalls of the CSP, in accordance with various examples.
Figure 2D:
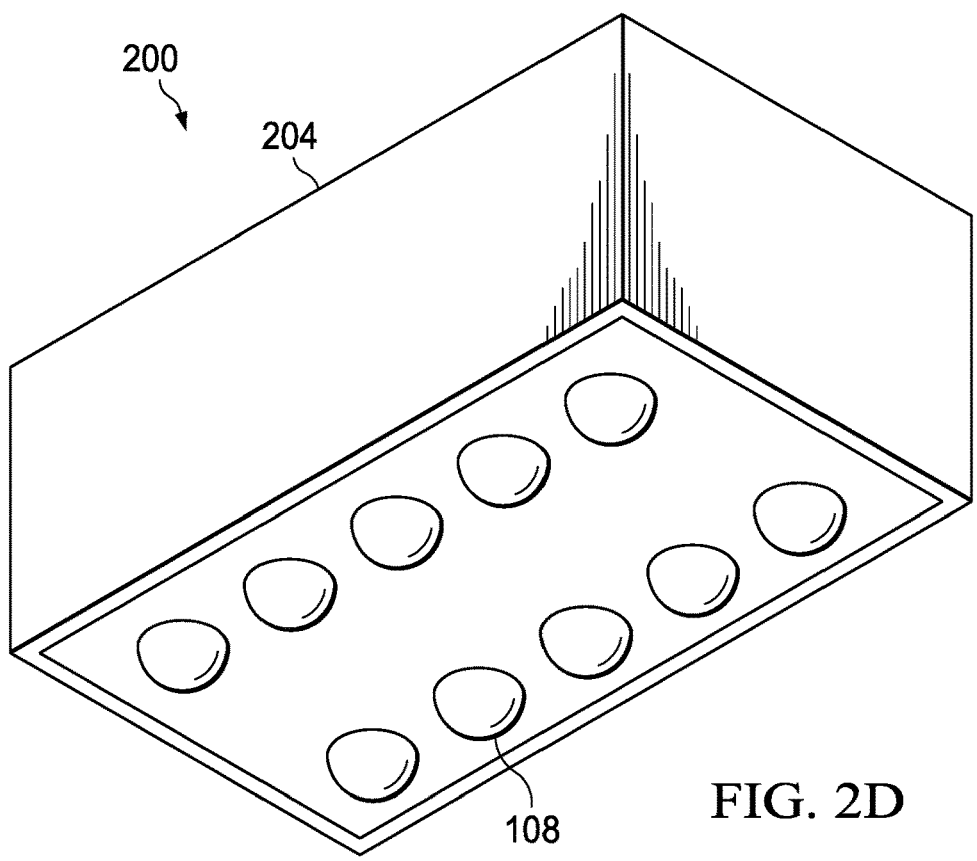
FIG. 2D depicts a perspective view of a CSP having a non-conductive coat on a backside and sidewalls of the CSP, in accordance with various examples.

FIG. 2B depicts a profile view of the CSP 200, in accordance with various examples. FIG. 2C depicts a top-down view of the CSP 200, in accordance with various examples. FIG. 2D depicts a perspective view of the CSP 200, in accordance with various examples.

Figure 3:
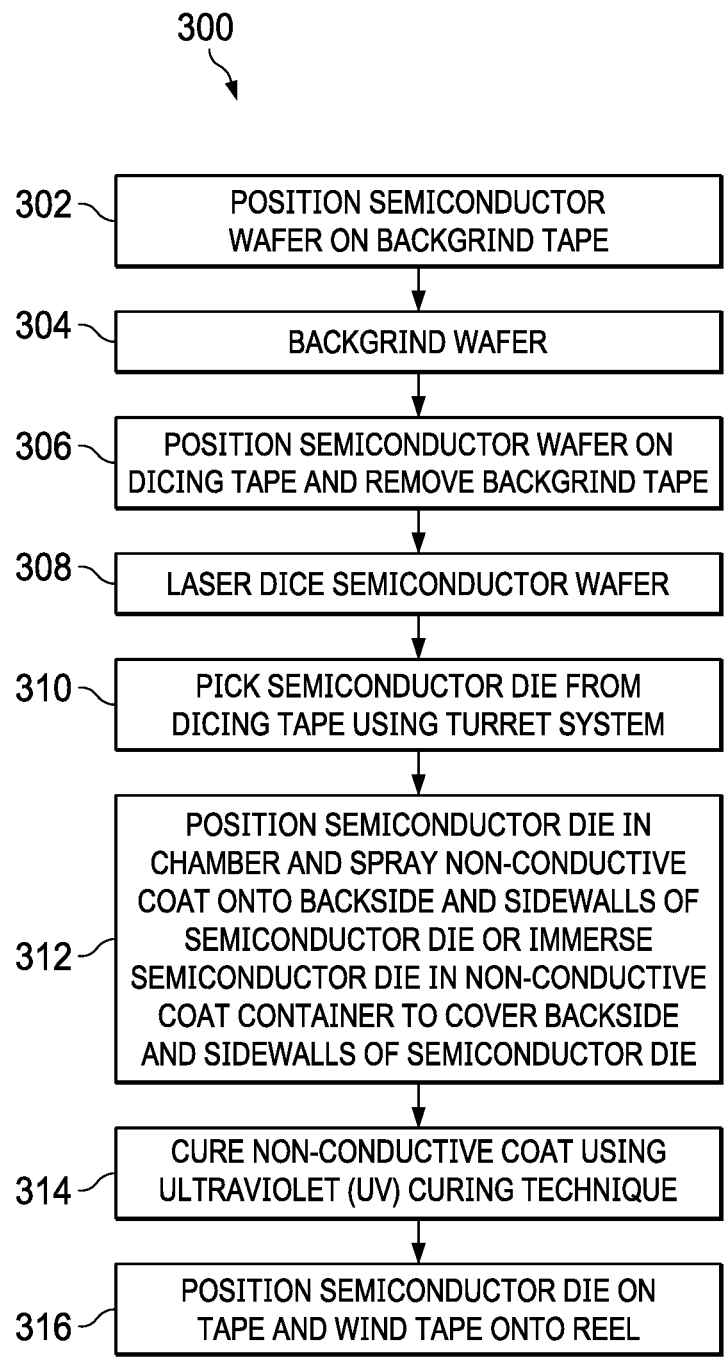
FIG. 3 depicts a flow diagram of a process for fabricating a CSP having a non-conductive coat on a backside and sidewalls of the CSP, in accordance with various examples.

FIG. 3 depicts a flow diagram of an example method 300 for fabricating the example CSPs 100 and 200, described above with respect to FIGS. 1A-1D and FIGS. 2A-2D. FIGS. 6A-6H depict an example process flow for fabricating the CSPs 100 and 200. Accordingly, the method 300 is now described with simultaneous reference to the process flow of FIGS. 6A-6H.

Figure 6A:
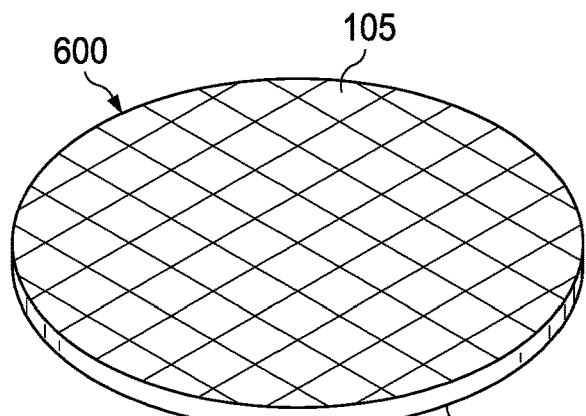
FIGS. 6A-6H depict a process flow for fabricating a CSP having a non-conductive coat on a backside and sidewalls of the CSP, in accordance with various examples.
Figure 6B:
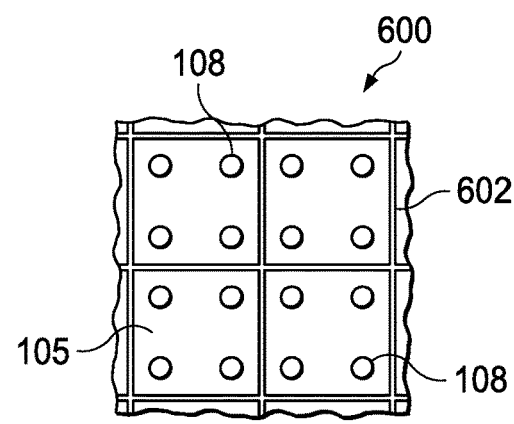
Figure 6C:
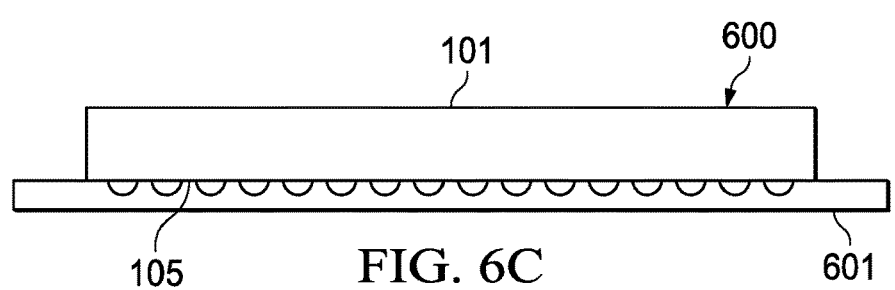

The method 300 begins with positioning a semiconductor wafer (e.g., having circuitry formed on an active surface) on a backgrind tape (302). FIG. 6A depicts a semiconductor (e.g., silicon) wafer 600 having an active surface 105 and a backside 101. FIG. 6B depicts the active surface 105 of the semiconductor wafer 600 having conductive terminals 108 positioned thereupon (e.g., on an RDL, not expressly shown). The semiconductor wafer 600 includes multiple scribe streets 602. FIG. 6C depicts the semiconductor wafer 600 positioned on a backgrind tape 601, with the active surface 105 in contact with the backgrind tape 601.

Figure 6D:
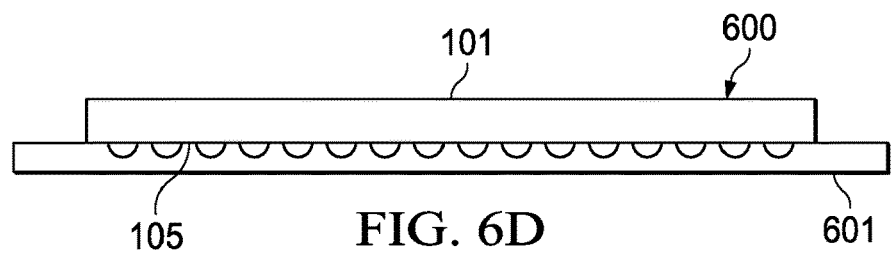

The method 300 then comprises backgrinding the semiconductor wafer (304). FIG. 6D depicts the semiconductor wafer 600 having been backgrinded such that the thickness of the semiconductor wafer 600 is reduced relative to the thickness of the semiconductor wafer 600 as shown in FIG. 6C.

Figure 6E:
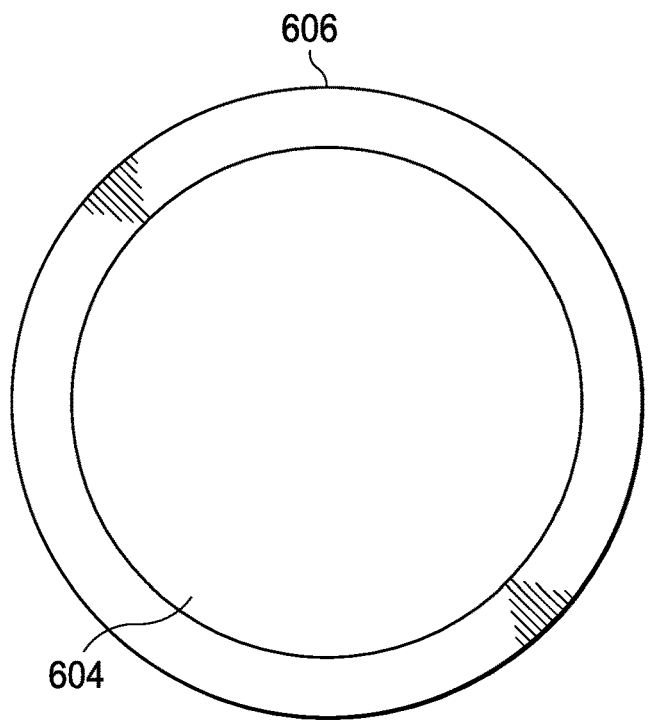
Figure 6F:
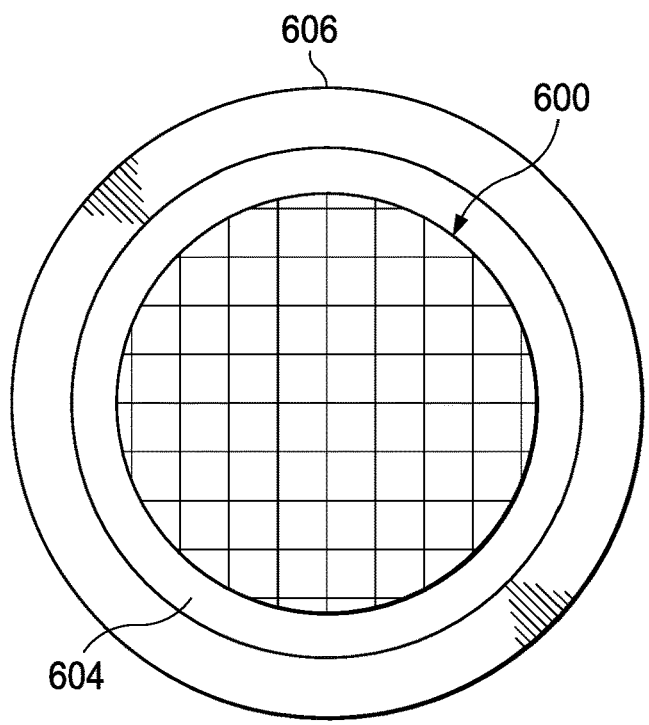

The method 300 subsequently comprises positioning the semiconductor wafer on dicing tape and removing the backgrind tape (306). FIG. 6E depicts a dicing tape 604 and a ring 606 circumscribing and coupled to the dicing tape 604. FIG. 6F depicts the semiconductor wafer 600 positioned on the dicing tape 604, with the backgrind tape 601 having been removed from the semiconductor wafer 600. As shown, the semiconductor wafer 600 is positioned on the dicing tape 604 with the active surface 105 facing away from the dicing tape 604 and the backside 101 abutting the dicing tape 604.

The method 300 then comprises laser dicing the semiconductor wafer (308) and picking a singulated semiconductor die from the dicing tape using, e.g., a turret system (310). Although a turret system is described, any suitable picking device may be used. In some examples, the method 300 comprises positioning the singulated semiconductor die in a chamber and spraying a non-conductive coat onto the backside and sidewalls of the semiconductor die (312). In other examples, the method 300 comprises immersing the singulated semiconductor die in a container of non-conductive material to cover the backside and sidewalls of the semiconductor die with a non-conductive coat (312).

Figure 6G:
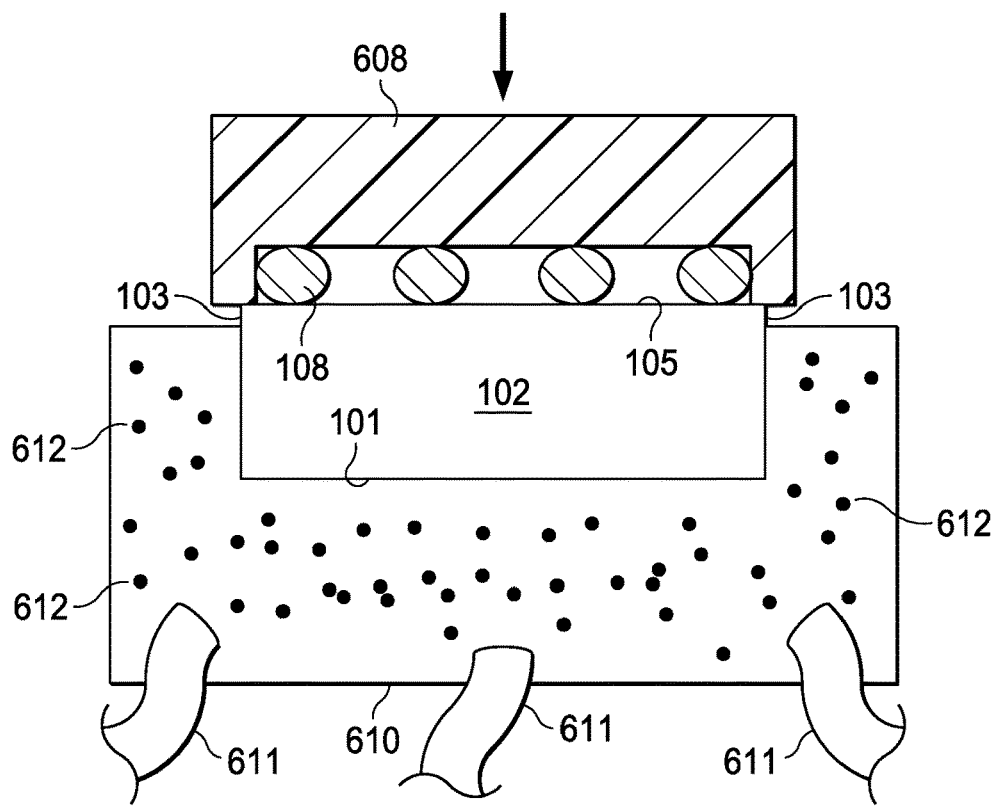

FIG. 6G depicts a chamber 610 having spray nozzles 611 that spray a non-conductive material 612 (e.g., an atomized spray) onto the backside 101 and sidewalls 103 of a semiconductor die 102. The semiconductor die 102 is held in position in the chamber 610 by a pick tip 608 (e.g., a turret system pick tip), with the active surface 105 facing the pick tip 608 and the backside 101 facing the chamber 610. In examples, the pick tip 608 positions the semiconductor die 102 in the chamber 610 such that the non-conductive material 612 forms a non-conductive coat on the backside 101 and on some, but not all, of each of the sidewalls 103. In such examples, the completed non-conductive coat may be similar to the non-conductive coat 104 shown in FIGS. 1A-1D. In other examples, the pick tip 608 positions the semiconductor die 102 in the chamber 610 such that the non-conductive material 612 forms a non-conductive coat on the backside 101 and on all of each of the sidewalls 103. In such examples, the completed non-conductive coat may be similar to the non-conductive coat 204 depicted in FIGS. 2A-2D. Other coating patterns are contemplated and included in the scope of this disclosure.

Figure 6H:
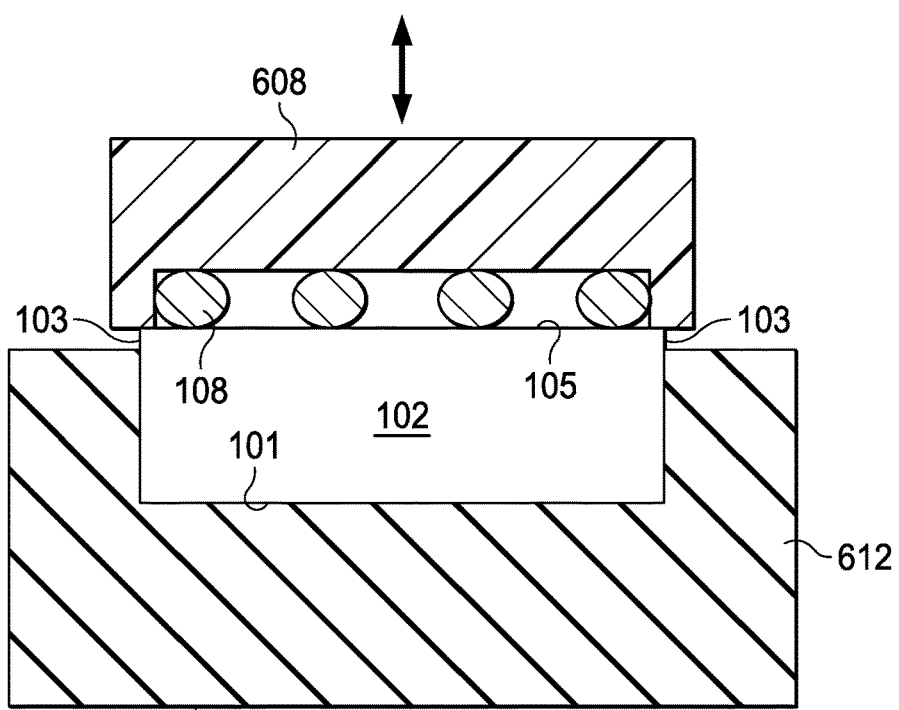

Alternatively to the spray technique depicted in FIG. 6G, in some examples, an immersion technique depicted in FIG. 6H may be used. FIG. 6H depicts a container 614 storing non-conductive material 612. The pick tip 608 (e.g., a turret system pick tip) immerses the semiconductor die 102 in the non-conductive material 612, as shown, thereby coating the backside 101 and the sidewalls 103 with the non-conductive material 612. In examples, the pick tip 608 positions the semiconductor die 102 in the container 614 such that the non-conductive material 612 forms a non-conductive coat on the backside 101 and on some, but not all, of each of the sidewalls 103. In such examples, the completed non-conductive coat may be similar to the non-conductive coat 104 shown in FIGS. 1A-1D. In other examples, the pick tip 608 positions the semiconductor die 102 in the container 614 such that the non-conductive material 612 forms a non-conductive coat on the backside 101 and on all of each of the sidewalls 103. In such examples, the completed non-conductive coat may be similar to the non-conductive coat 204 depicted in FIGS. 2A-2D. Other coating patterns are contemplated and included in the scope of this disclosure. The non-conductive coats 104, 204 applied using a spray technique (as in FIG. 6G) or a dip technique (as in FIG. 6H) as described herein may differ from traditional mold compounds applied to semiconductor packages using conventional techniques. For example, traditional mold compounds may use filler material, such as silicon dioxide, which cause the mold compounds to be thick, brittle, and rough-textured when applied to semiconductor packages. In contrast, the non-conductive coats 104, 204, having been applied using spray or dip techniques, may be thinner, less brittle, and smoother than traditional mold compounds because they exclude the aforementioned filler materials. For example, each of the non-conductive coats 104, 204 may have a thickness in one of the ranges described above, or no more than 50 microns, while a mold compound including fillers may have a thickness of at least 50 microns, and more typically 70 microns or more. Thus, the thicknesses of the non-conductive coats 104, 204 are not mere design choices, but rather are the result of the novel spray and/or dip techniques described herein.

A lack of fillers in the non-conductive coats 104, 204 also produces a smoother surface because the non-conductive material in the non-conductive coats 104, 204, when cured, does not contract around filler particles and thus does not produce a substantial topography (e.g., roughness or texture). In some examples, a differential between peaks and troughs on the surfaces of the non-conductive coats 104, 204 may be on the order of 0.01 microns or less, while the differential between peaks and troughs on surfaces of traditional mold compounds including fillers may be on the order of 1 micron or more. Thus, the textures of the surfaces of non-conductive coats 104, 204 are not mere design choices, but instead are a result of the novel spray and/or dip techniques described herein.

Regardless of the technique used to apply the non-conductive coat to the semiconductor die 102, the method 300 then comprises curing the non-conductive coat, for example, using an ultraviolet (UV) curing technique (314). Other curing techniques, for example using heat, also are contemplated and included in the scope of this disclosure. The method 300 comprises positioning the semiconductor die on a tape and winding the tape onto a reel (316).

Figure 4:
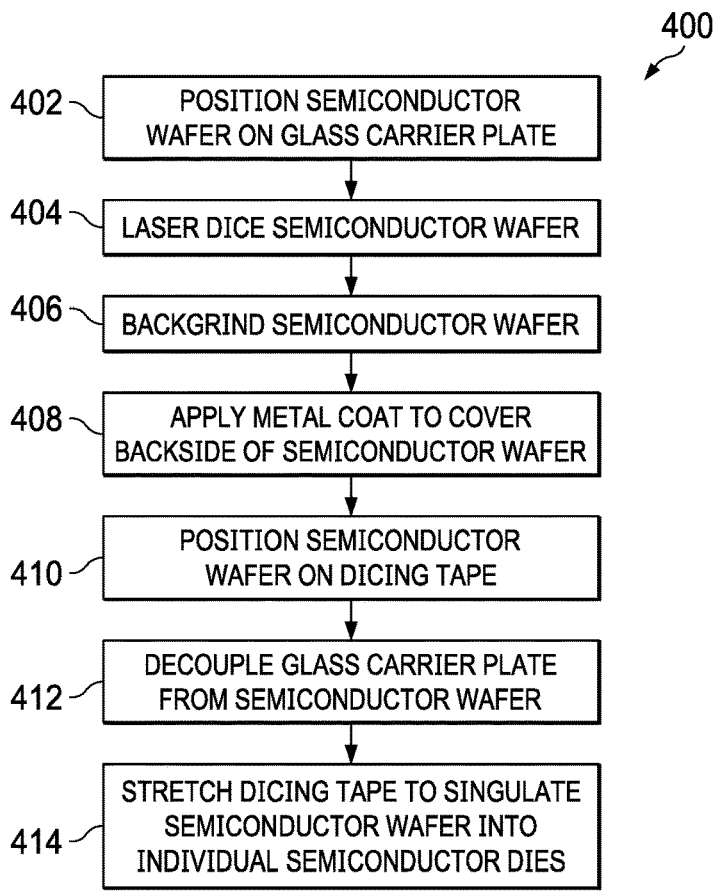
FIG. 4 depicts a flow diagram of a process for fabricating a semiconductor die having a metal coat on a backside of the semiconductor die, in accordance with various examples.

FIG. 4 depicts a flow diagram of a method 400 for fabricating a semiconductor die having a conductive metal coat on a backside of the semiconductor die, in accordance with various examples. FIGS. 7A-7J depict a process flow for fabricating a semiconductor die having a conductive metal coat on a backside of the semiconductor die, in accordance with various examples. Accordingly, FIG. 4 and FIGS. 7A-7J are now described in tandem.

Figure 7A:
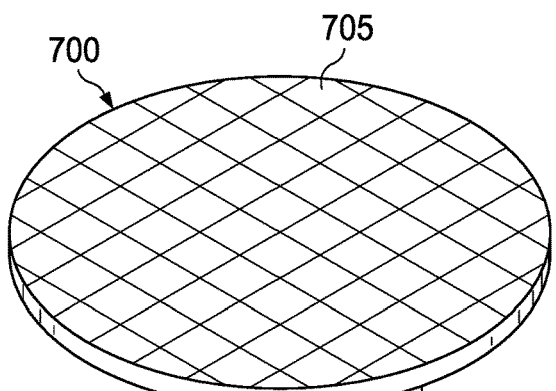
Figure 7B:
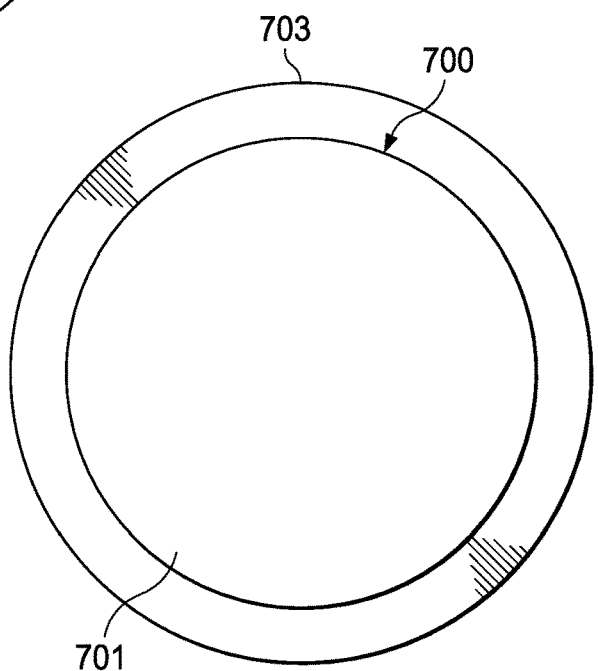

The method 400 begins with positioning a semiconductor wafer on a glass carrier plate (402), although other types of carrier wafers also may be used. FIG. 7A depicts a semiconductor wafer 700 having an active surface 705 and a backside 701. FIG. 7B depicts a glass carrier plate 703 and the semiconductor wafer 700 positioned on the glass carrier plate 703. In examples, the semiconductor wafer 700 is positioned on the glass carrier plate 703 with the active surface 705 facing the glass carrier plate 703 and the backside 701 facing away from the glass carrier plate 703. In examples, the semiconductor wafer 700 adheres to the glass carrier plate 703 using a suitable adhesive, such as ultraviolet light released epoxy, wax, or resin.

Figure 7C:
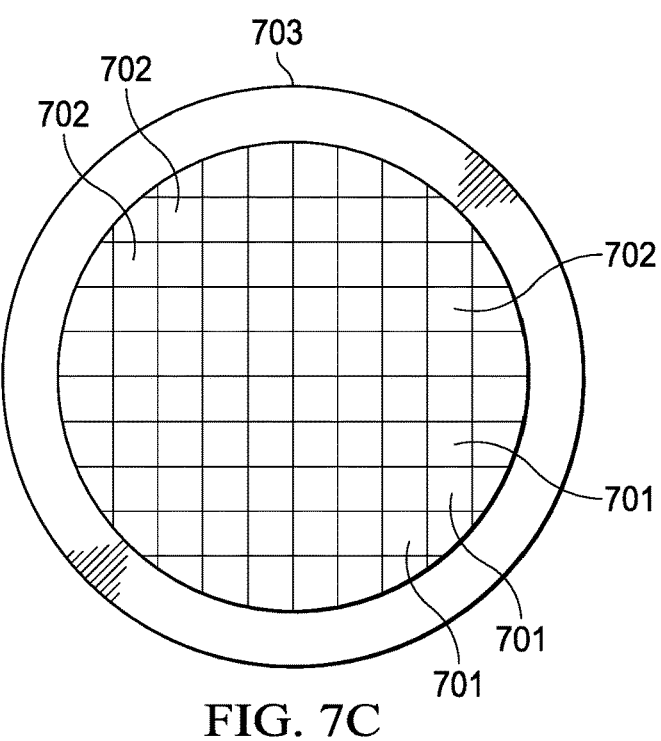

The method 400 then comprises laser dicing the semiconductor wafer (404), for example, through the backside 701 of the semiconductor wafer 700. The laser dicing process produces singulated semiconductor dies 702, as shown in FIG. 7C. The method 400 subsequently comprises backgrinding the semiconductor wafer (406). FIG. 7D1 depicts a profile view of the semiconductor wafer 700 positioned on the glass carrier plate 703, and FIG. 7E1 depicts a profile view of the semiconductor wafer 700 post-backgrind.

A semiconductor die produced using the method 400 may be identified, for example, by an absence of laser dicing cracks on a sidewall of the semiconductor die. Specifically, laser dicing produces one or more dicing cracks near a surface at which the laser enters the semiconductor wafer. FIG. 7D2 depicts a profile view of a semiconductor die sidewall having laser dicing cracks 720 formed by a laser saw adjacent the backside 701 of the semiconductor die. Backgrinding the semiconductor die post-laser dicing causes these laser dicing cracks 720 to be removed because the portions of the die containing the laser dicing cracks 720 are grinded away, as depicted in FIG. 7E2. Thus, a semiconductor die that was singulated using a laser saw and that was subsequently backgrinded produces a sidewall without laser dicing cracks. In addition, because the method 400 entails the use of a laser saw, a semiconductor die produced using the method 400 will lack mechanical saw dicing grooves that are typically seen in sidewalls of mechanically-sawed dies.

Figure 7F:
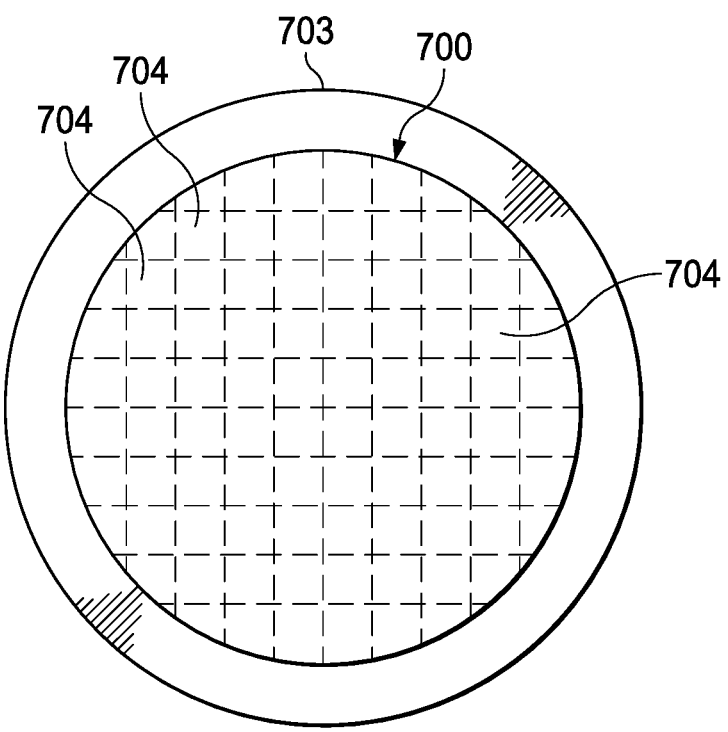

The method 400 then comprises applying a metal coat to cover a backside of the semiconductor wafer (408). FIG. 7F depicts a metal coat 704 having been positioned on the backside of the semiconductor wafer 700. In examples, the metal coat 704 is applied with a plating process, such as an electroplating process, although other techniques also may be used. The metal coat 704 may comprise any suitable type of metal, including gold, silver, or tin. In examples, the thickness of the metal coat 704 ranges from 3 microns to 5 microns. In examples, the thickness of the metal coat 704 ranges from 2 microns to 6 microns. In examples, the thickness of the metal coat 704 ranges from 1 micron to 7 microns. In examples, the thickness of the metal coat 704 ranges from 0.5 microns to 10 microns. The thickness of the metal coat 704 is not a mere design choice. Rather, a thicker metal coat 704 has advantages that include enhanced protection from ambient light, but has disadvantages that include increased cost and greater package size. Conversely, a thinner metal coat 704 has advantages that include reduced cost and smaller package size, but has disadvantages that include lesser protection from ambient light.

Figure 7G:
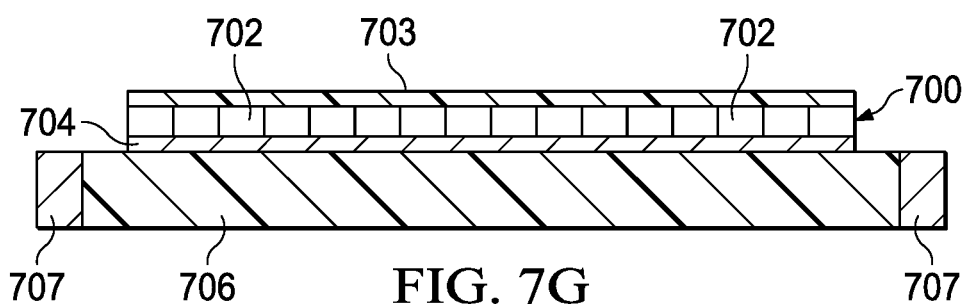
Figure 7H:
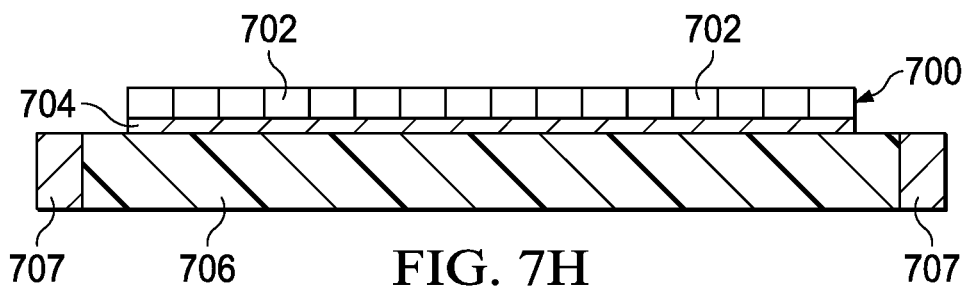

The method 400 then comprises positioning the semiconductor wafer on a dicing tape (410). FIG. 7G depicts a cross-sectional view of the semiconductor wafer 700 positioned on a dicing tape 706, with a ring 707 circumscribing and coupled to the dicing tape 706. The metal coat 704 abuts the dicing tape 706. The method 400 comprises decoupling the glass carrier plate from the semiconductor wafer (412), as FIG. 7H depicts with the removal of the glass carrier plate 703. In examples, a laser technique is used to decouple the glass carrier plate 703 from the semiconductor wafer 700.

Figure 7I:
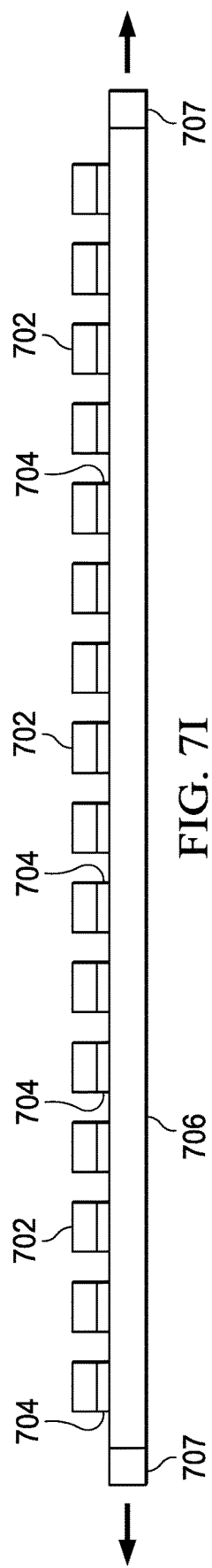
Figure 7J:
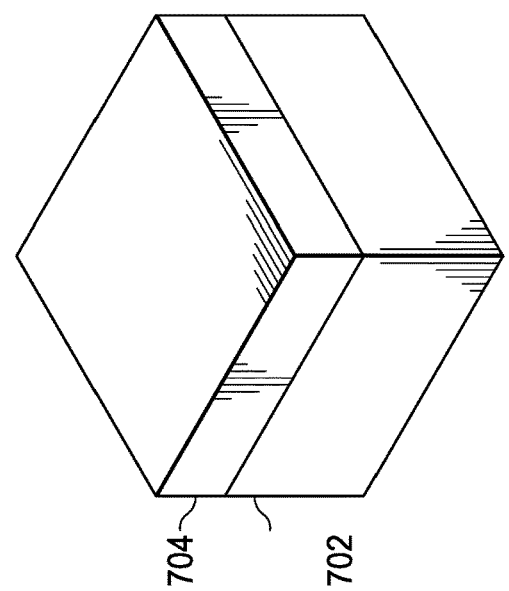

The method 400 next includes stretching the dicing tape (e.g., using an expander tool) to singulate the semiconductor wafer into individual semiconductor dies (414). The stretching of the dicing tape separates the metal coat into individual metal coats, each individual metal coat abutting a different semiconductor die. For example, as FIG. 7I depicts, stretching the dicing tape 706 as shown causes the semiconductor dies 702 to be moved apart from each other, thereby causing the metal coat 704 to be divided into individual metal coats 704, each individual metal coat 704 covering a different semiconductor die 702. FIG. 7J depicts a perspective view of an example metal coat 704 covering the backside of an example semiconductor die 702. As shown, the metal coat 704 covers one surface (e.g., plane) of the semiconductor die 702.

Figure 5:
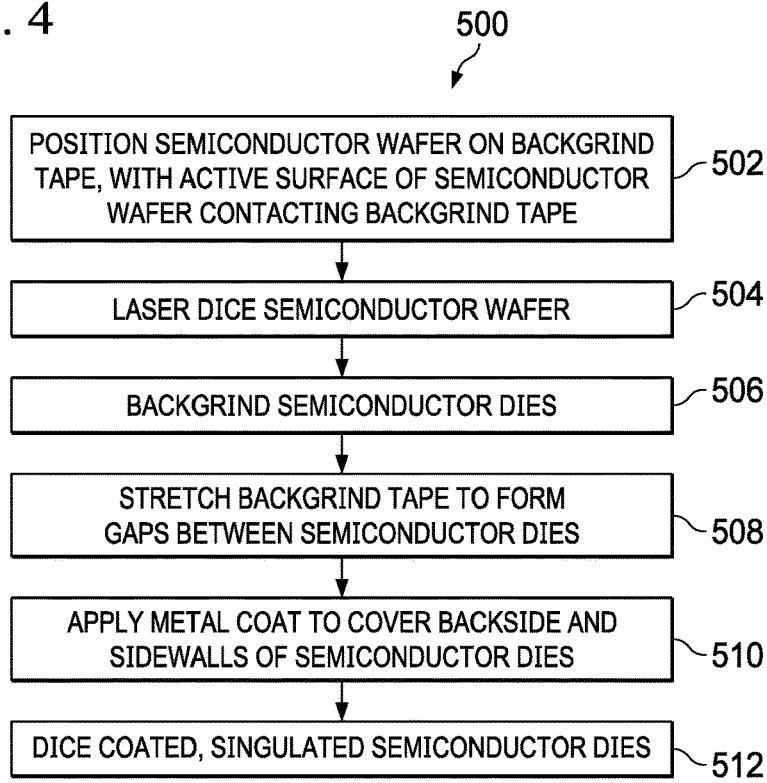
FIG. 5 depicts a flow diagram of a process for fabricating a semiconductor die having a metal coat on a backside and sidewalls of the semiconductor die, in accordance with various examples.

The metal coat 704 covers the backside of the semiconductor die 702. In some examples, however, a metal coat may cover the backside and the sidewalls of a semiconductor die. FIG. 5 depicts a flow diagram of a method 500 for fabricating a semiconductor die having a metal coat covering a backside and sidewalls of the semiconductor die, in accordance with various examples. FIGS. 8A-8H depict a process flow for fabricating a semiconductor die having a metal coat covering a backside and sidewalls of the semiconductor die, in accordance with various examples. Accordingly, FIG. 5 and FIGS. 8A-8H are now described in tandem.

Figure 8A:
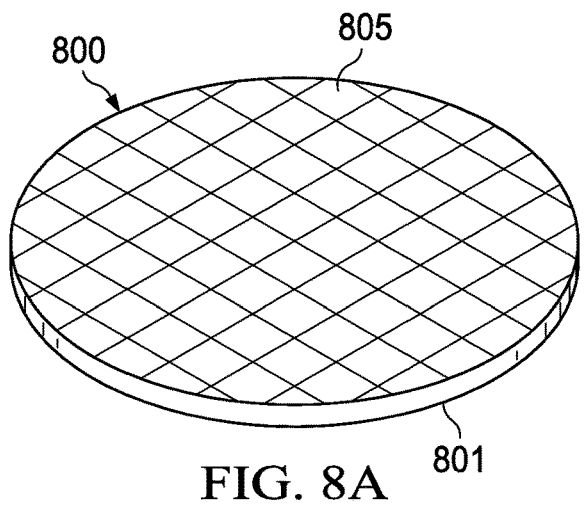
FIGS. 8A-8H depict a process flow for fabricating a semiconductor die having a metal coat on a backside and sidewalls of the semiconductor die, in accordance with various examples.
Figure 8B:
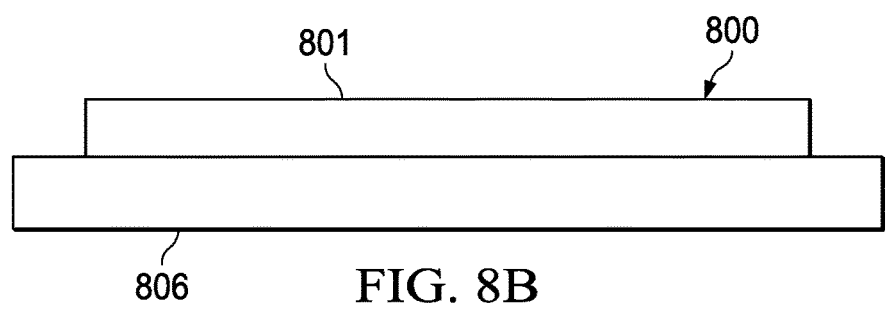
Figure 8C:
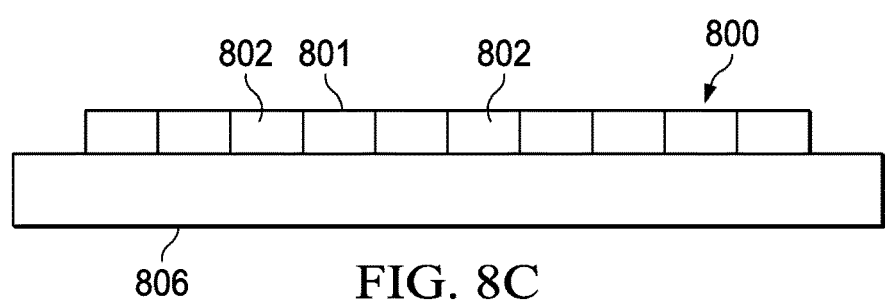
Figure 8D:
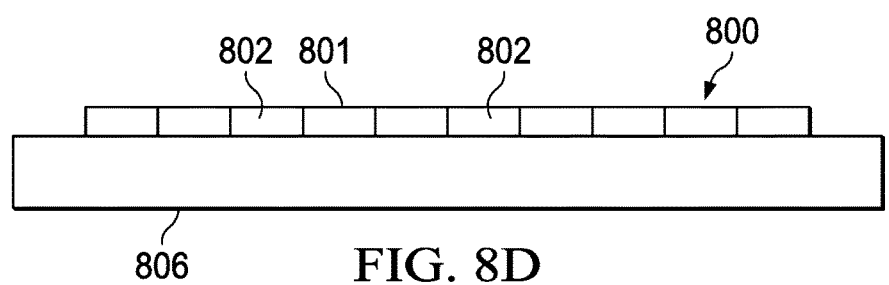

The method 500 begins with positioning a semiconductor wafer on backgrind tape, with the active surface of the semiconductor wafer contacting the backgrind tape (502). FIG. 8A depicts a semiconductor wafer 800 having an active surface 805 and a backside 801. FIG. 8B depicts the semiconductor wafer 800 positioned on a backgrind tape 806. The method 500 subsequently comprises laser dicing the semiconductor wafer (504). FIG. 8C depicts the semiconductor wafer 800 having been laser diced, and thereby singulated, into individual semiconductor dies 802. The method 500 next comprises backgrinding the semiconductor dies (506), the result of which is shown in FIG. 8D, with the semiconductor dies 802 being thinner than they are in FIG. 8C. A post-laser dicing backgrind mitigates or eliminates laser dicing cracks, similar to the above description of FIGS. 7D2 and 7E2.

Figure 8E:
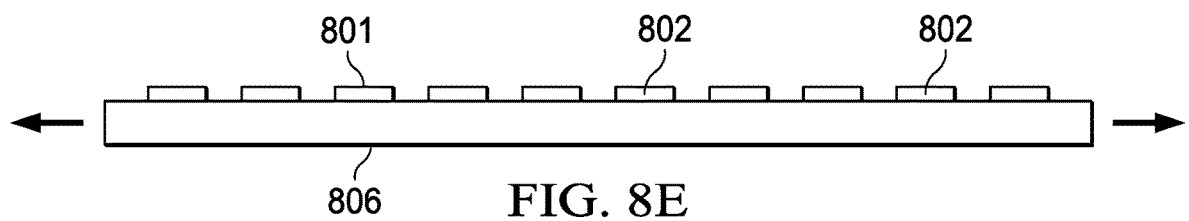
Figure 8F:
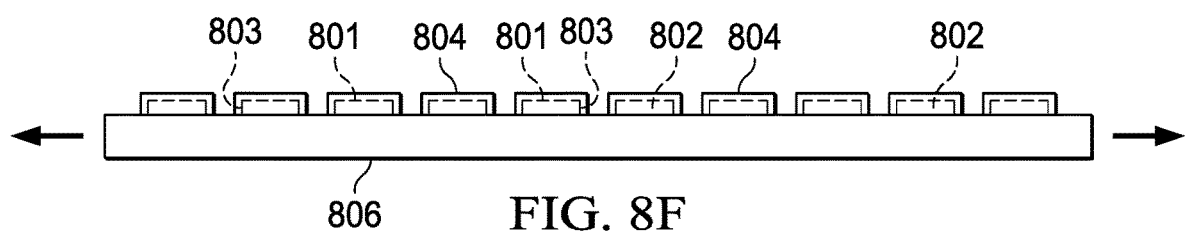
Figure 8G:
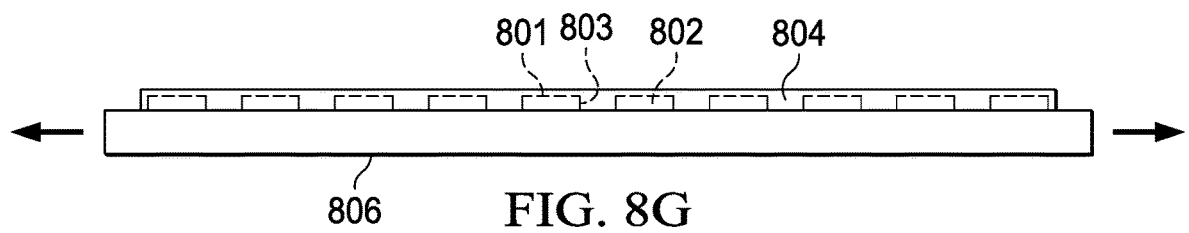
Figure 8H:
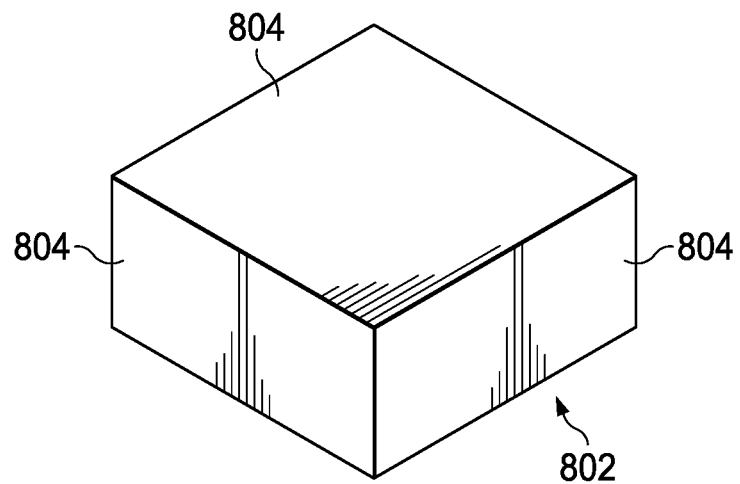

The method 500 next comprises stretching the backgrind tape (e.g., using an expander tool) to form gaps between singulated semiconductor dies (508). FIG. 8E depicts a stretching of the backgrind tape 806 and the resultant separation of the semiconductor dies 802. The method 500 also comprises applying a metal coat to cover a backside and sidewalls of the semiconductor dies (510). FIG. 8F depicts application of a metal coat 804 to the backsides 801 and sidewalls 803 of the semiconductor dies 802. Because the semiconductor dies 802 have been separated from each other by stretching of the backgrind tape 806, a sufficiently large gap is present between each of the semiconductor dies 802, thereby allowing the metal to coat the backsides 801 and sidewalls 803 of the semiconductor dies 802. The spacing between the semiconductor dies 802 as shown in FIGS. 8E and 8F is exaggerated to demonstrate the fact that the semiconductor dies 802 are sufficiently separated to facilitate metal coating of the sidewalls 803. However, in some examples, the gap between the semiconductor dies 802 may be narrower than shown in FIG. 8F, such that the metal coating the sidewalls 803 of successive semiconductor dies 802 remains in contact, as FIG. 8G shows. In such examples, a saw (e.g., mechanical saw) may be used to dice the metal-filled gaps between the semiconductor dies 802 (512), thereby producing semiconductor dies 802 having backsides 801 and sidewalls 803 covered by the metal coat 804. FIG. 8H depicts a perspective view of an example semiconductor die 802 having a backside and sidewalls covered by a metal coat 804. As shown, the metal coat 804 covers five surfaces (e.g., planes) of the semiconductor die 802.

Figure 9:
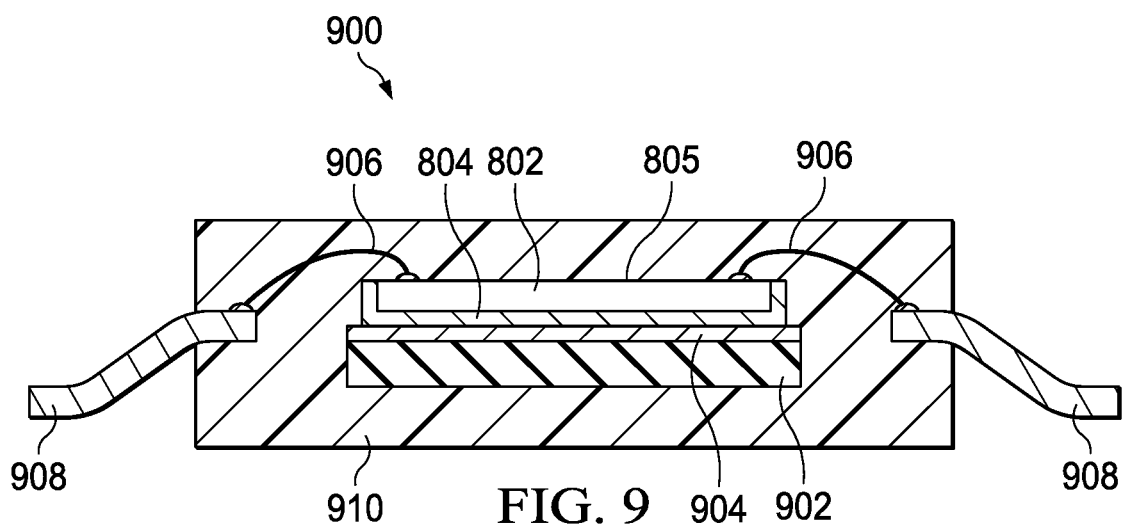
FIG. 9 depicts a semiconductor package containing a semiconductor die having a metal coat on a backside and sidewalls of the semiconductor die, in accordance with various examples.

FIG. 9 depicts a semiconductor package 900 containing a semiconductor die 802 having a metal coat 804 on a backside and sidewalls of the semiconductor die 802, in accordance with various examples. The semiconductor package 900 further comprises a die attach 904 positioned between the metal coat 804 and a die pad 902. An active surface 805 of the semiconductor die 802 couples to conductive terminals 908 via bond wires 906, as shown. A mold compound 910 covers the various components of the semiconductor package 900. The semiconductor package 900 is depicted as being, e.g., a dual inline package (DIP), but the semiconductor die 802 may be incorporated into other types of packages as desired and as may be suitable. In addition, although the semiconductor die 802 is depicted as having the metal coat 804 on the backside and sidewalls of the semiconductor die 802, in examples, the metal coat 804 has a different configuration (e.g., covering the backside of the semiconductor die 802 but not the sidewalls of the semiconductor die 802).

In the foregoing discussion and in the claims, the terms "including" and "comprising" are used in an open-ended fashion, and thus should be interpreted to mean "including, but not limited to . . . ." Unless otherwise stated, "about," "approximately," or "substantially" preceding a value means +/−10 percent of the stated value. The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A chip scale package (CSP), comprising:
a semiconductor die;
a conductive terminal coupled to the semiconductor die; and
a non-conductive coat including a top portion covering a backside of the semiconductor die and a sidewall portion covering a sidewall of the semiconductor die, the non-conductive coat having a thickness of less than 45 microns, the sidewall portion of the non-conductive coat having a uniform thickness on the sidewall of the semiconductor die and the top portion having a width corresponding to a sum of a width of the semiconductor die and twice of the uniform thickness of the sidewall portion, wherein a strip of the sidewall of the semiconductor die is exposed and the sidewall portion terminates at the strip of the sidewall, wherein the strip of the sidewall abuts a frontside of the semiconductor die opposite the backside.

2. The CSP of claim 1, wherein the CSP comprises a wafer level CSP (WCSP).

3. The CSP of claim 1, wherein the non-conductive coat comprises an epoxy.

4. The CSP of claim 1, wherein the uniform thickness of the sidewall portion of the non-conductive coat ranges from 2 microns to 6 microns.

5. The CSP of claim 1, wherein the non-conductive coat is to block at least one type of light from entering the semiconductor die.

6. The CSP of claim 1, wherein the non-conductive coat abuts the backside of the semiconductor die and four sidewalls of the semiconductor die.

7. The CSP of claim 1, wherein the non-conductive coat abuts the backside of the semiconductor die and at least some, but not all, of each of four sidewalls of the semiconductor die.

8. A package, comprising:
a semiconductor die;
a conductive terminal coupled to a first surface of the semiconductor die; and
a non-conductive coat including a first portion covering a second surface of the semiconductor die opposite the first surface and a second portion covering a sidewall of the semiconductor die, the second portion of the non-conductive coat having a uniform thickness on the sidewall of the semiconductor die and the first portion having a width corresponding to a sum of a width of the semiconductor die and twice of the uniform thickness of the second portion, wherein a strip of the sidewall of the semiconductor die is exposed and the second portion terminates at the strip of the sidewall, and wherein the strip of the sidewall abuts the first surface.

9. The package of claim 8, wherein the uniform thickness is a second uniform thickness, and wherein the first portion of the non-conductive coat has a first uniform thickness on the second surface of the semiconductor die.

10. The package of claim 9, wherein the first uniform thickness on the second surface of the semiconductor die is same as the second uniform thickness of the sidewall of the semiconductor die.

11. The package of claim 8, wherein the non-conductive coat abuts the second surface of the semiconductor die and at least some, but not all, of each of four sidewalls of the semiconductor die.

12. The package of claim 8, wherein the non-conductive coat comprises at least one of epoxy, resin, paint, tape, mold compound, or laminate.

13. A package, comprising:
a semiconductor die including a backside and a frontside opposite the backside; and
a non-conductive coat including a first portion covering the backside of the semiconductor die and a second portion covering a sidewall of the semiconductor die, the first portion having a first uniform thickness and the second portion having a second uniform thickness, wherein
the first portion has a width corresponding to a sum of a width of the semiconductor die and twice of the second uniform thickness; and
a strip of the sidewall of the semiconductor die is exposed and the second portion terminates at the strip of the sidewall, wherein the strip of the sidewall abuts the frontside.

14. The package of claim 13, wherein the semiconductor die includes optical circuitry.

15. The package of claim 14, further comprising:
a conductive terminal coupled to the frontside of the semiconductor die, wherein the conductive terminal is coupled to the optical circuitry.

16. The package of claim 13, wherein the first uniform thickness is same as the second uniform thickness.

17. The package of claim 13, wherein the strip of the sidewall has a width ranging from 10 microns to 15 microns.

18. The package of claim 13, wherein the non-conductive coat is exclusive of filler particles.

19. The package of claim 13, wherein the non-conductive coat is configured to block at least one type of light from entering the semiconductor die.

* * * * *